US008317542B2

(12) United States Patent
Abraham

(10) Patent No.: US 8,317,542 B2
(45) Date of Patent: Nov. 27, 2012

(54) HIGH-SPEED CARD CONNECTOR

(75) Inventor: Euan Abraham, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 61 days.

(21) Appl. No.: 12/894,437

(22) Filed: Sep. 30, 2010

(65) Prior Publication Data

US 2012/0083157 A1    Apr. 5, 2012

(51) Int. Cl.
*H01R 13/648*    (2006.01)

(52) U.S. Cl. .................................. 439/607.31

(58) Field of Classification Search ............ 439/79, 439/108, 495, 607.01, 607.31–607.33, 607.35, 439/607.23, 607.4, 636–637
See application file for complete search history.

(56) References Cited

U.S. PATENT DOCUMENTS

| 5,004,426 | A  | * | 4/1991 | Barnett ........................ 439/82 |
| 6,575,791 | B1 | * | 6/2003 | Korsunsky ................... 439/637 |
| 7,021,942 | B2 | * | 4/2006 | Grant et al. .................... 439/66 |
| 7,614,920 | B1 | * | 11/2009 | Yi ................................ 439/682 |
| 7,914,321 | B2 | * | 3/2011 | Huang ........................ 439/495 |
| 2006/0040556 | A1 | * | 2/2006 | Neer et al. .................... 439/607 |

* cited by examiner

*Primary Examiner* — Khiem Nguyen
(74) *Attorney, Agent, or Firm* — Kilpatrick Townsend & Stockton LLP

(57) ABSTRACT

Connectors to connect optional or daughter cards or boards to main or motherboards. One example provides a connector that is capable of supporting high-speed data rates by employing contacts that provide short signal paths and a ground plane to improve signal quality. The space consumed in electronic devices may be reduced by providing a connector having a low profile, while another example may provide a connector having mechanical stability. Another example provides a connector having an increased manufacturability.

25 Claims, 10 Drawing Sheets

HIGH-SPEED CARD CONNECTOR

BACKGROUND

The number and types of electronic devices on the market have grown tremendously the past few years. Tablet, netbook, laptop, and all-in-one computers, media players, handheld media players, cell phones, and other devices have proliferated. These devices have proliferated not only in the types that are available, but also as to the functionality they include.

Moreover, options for some particular devices have also proliferated. For example, for a particular device, the size of an internal memory may be an option. Other functionalities, such as video or graphics cards, network connections, and others, may also be made available as options or as possible upgrades. This allows a manufacturer to offer products at several price points, and allows customers to buy only the amount of functionality that is required to suit their needs and to possibly upgrade at a later time.

In these devices, various options may be added by including an optional card or board inside a housing of the electronic device. Also, certain cards or boards may be manufactured separately, for example, by a different manufacturer. In these and other situations, it may be desirable to include the card in the electronic device as a daughter card or board. These optional or daughter cards or boards may be attached to a main or motherboard. Specifically, these optional or daughter cards or boards may be attached to a board inside the electronic device housing using a connector.

Unfortunately, these connectors consume space inside the electronic device housing. This consumed space may increase the size of the electronic device or reduce the functionality that could otherwise be included in the electronic device. Also, data rates among devices in these electronic devices have increased tremendously. Using a connector may degrade signal quality and reduce the data rates to a lower frequency that may otherwise be achievable.

Thus, what is needed are connectors that can be used to connect optional or daughter cards or boards to main or motherboards in electronic devices. It may also be desirable for these connectors to have a reduced size and to be able to support high data rates.

SUMMARY

Accordingly, embodiments of the present invention may provide connectors to connect optional or daughter cards or boards to main or motherboards. An illustrative embodiment of the present invention may provide a connector that is capable of supporting high-speed data rates. This connector may employ contacts that provide short signal paths. The contacts may have a first prong and a second prong. The first prong may attach to a surface of a main or motherboard. The second prong may form an electrical connection with a contact on a daughter or optional card or board. This embodiment may also provide a ground plane to improve signal quality. In a specific embodiment of the present invention, the ground plane may be on a top side of a connector and contacts for power and data may be on a second side of the connector. In this or other embodiments of the present invention, the ground plane may be split into two or more portions. In this way, in the event of warping of the connector shield, the ground plane may still contact the daughter or optional board in multiple locations. In a specific embodiment of the present invention, the ground plane may be split into three portions.

Another illustrative embodiment of the present invention may reduce the space consumed in electronic devices by providing a connector having a low profile. This low profile may be achieved by having the short signal paths, where each signal path may include contacts having a first prong that attaches to a main or motherboard and a second prong that forms an electrical connection to a contact on the daughter or optional board.

Another illustrative embodiment of the present invention may also provide a connector having mechanical stability. In a specific embodiment of the present invention, this may be achieved by providing a contact having a third prong. This third prong may be located parallel to a bottom surface of the connector as to reduce or eliminate any increase in the profile or height of the connector that may otherwise result due to its inclusion.

Another illustrative embodiment of the present invention may provide a connector having an increased manufacturability. In a specific embodiment of the present invention, the first contact prongs may be surface mount leads. These surface mount leads may be located in front of the connector. When these surface mount leads are connected to a board by soldering or other method, the connection to the board may be easily inspected. In another specific embodiment of the present invention, the connector may include one or more windows. These windows may allow inspection of an inserted daughter or optional card. Specifically, these windows may be used to ensure that a daughter or optional card is fully inserted into the connector.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Electronic devices often include a first printed circuit board onto which one or more circuits are attached. Signal traces and ground and power planes on the first printed circuit board connect these circuits together, such that a desired functionality is achieved. This first printed circuit board may also be referred to using other terms, such as motherboard, main board, or multilayer board.

On occasion, it may be desirable to attach a second printed circuit board to this first printed circuit board for each electronic device. This second printed circuit board may be referred to as a daughter card or board. For example, it may be desirable to attach a video card to a first printed circuit board for each of a particular type of electronic device made. In other situations, it may be desirable to provide optional cards or boards that may be attached to the first printed circuit board. For example, additional memory may be made available on optional cards that may be attached to the first printed circuit board. This enables a supplier to provide devices having varying amounts of memory. Also, other types of functionality, such as wireless or other networking functions, may be included on these optional cards. Accordingly, embodiments of the present invention provide connectors that may attach these daughter or optional cards to the first printed circuit board.

Figure 1:
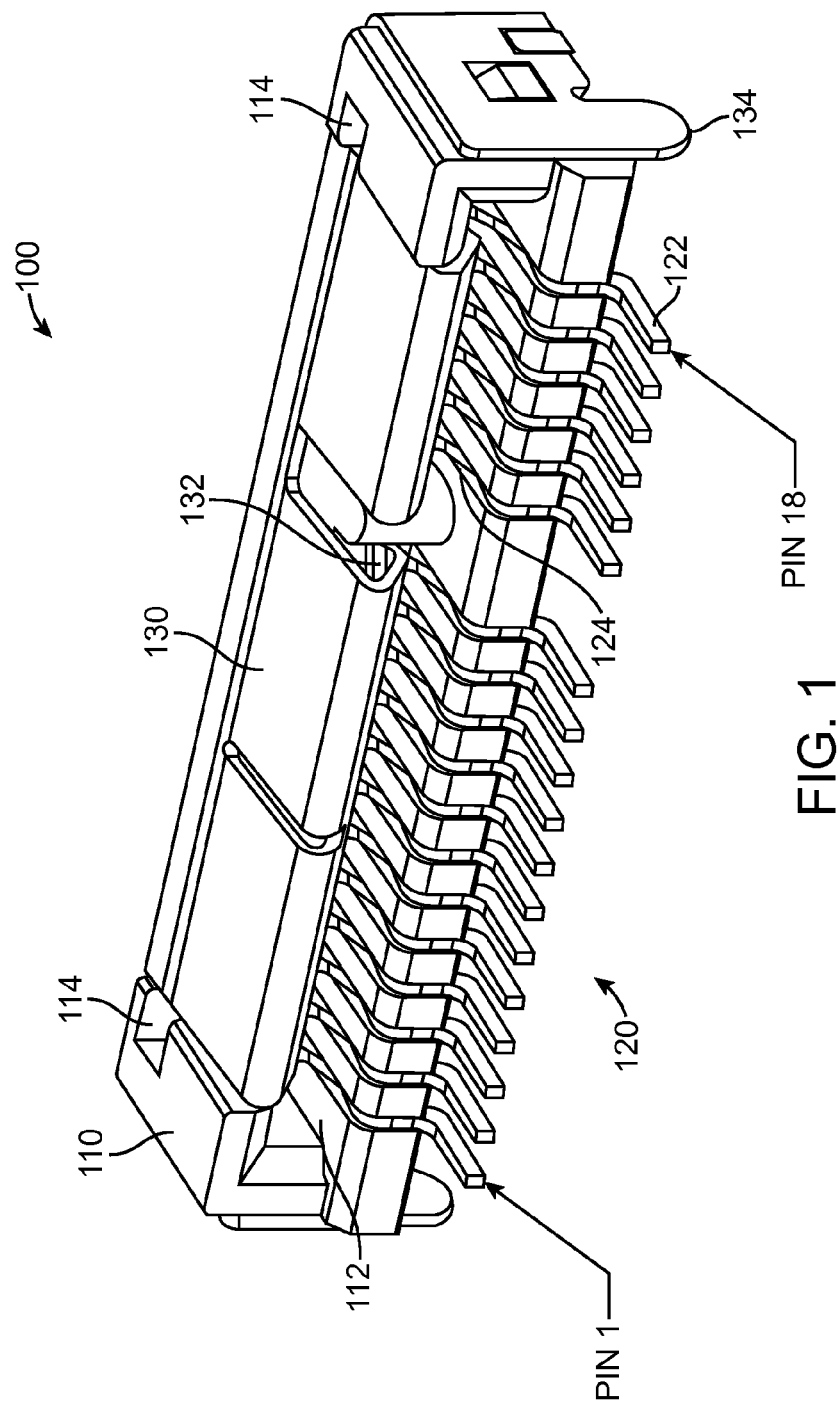
FIG. 1 illustrates a top perspective view of a connector according to an embodiment of the present invention.

FIG. 1 illustrates a top perspective view of a connector according to an embodiment of the present invention. This figure, as with the other included figures, is shown for illustrative purposes and does not limit either the possible embodiments of the present invention or the claims.

Connector 100 may include insulative housing 110, a plurality of contacts 120, and shield 130. This connector may be mounted on a printed circuit board. The printed circuit board may be a motherboard, main board, multilayer board, or other type of board. Connector 100 may be adapted to receive a card or board, such as a daughter or optional card or board.

Insulative housing 110 may include front side opening 112 for receiving a daughter or optional card. Insulative housing 110 may also include one or more openings 114, shown in this example on a top side of insulative housing 110. These one or more openings 114 may be used to visually or otherwise determine that a card is properly inserted into connector 100.

In this example, each of the plurality of contacts 120 may include a first portion 122 and a second portion 124. First portion 122 may extend away from a front of housing 110. First portion 122 may be used to make contact with a contact or pad located on a printed circuit board. Second portion 124 may be approximately in line with first portion 122. Second portion 124 may make contact with a contact on a card when the card is inserted into connector 100. Each of the contacts 120 may also include a third portion (not shown) for mechanical stability, as will be discussed below.

Shield 130 may cover at least a top portion and a back portion of connector 100. Shield 130 may be used as a ground plane, where it connects to one or more ground contacts on a card and one or more ground contacts on the printed circuit board. Shield 130 may be split into two or more portions. In this specific example, shield 130 may be split into three portions. Splitting shield 130 into portions may improve the grounding provided by shield 130 by ensuring that shield 130 comes into contact with ground contacts on a card at three or more points when the card is inserted into connector 100. In this specific example, one or more portions 132 of shield 130 may be folded back under a top portion of shield 130. With this arrangement, when a card is inserted into opening 112 of connector 100, shield portion 132 may press down on a top surface of the card, thereby engaging one or more ground contacts. This action may also push contacts on the card into second portions 124 of contacts 120 to form electrical pathways. Tabs 134 may be located on shield 130 and may be used to connect shield 130 to grounds on a printed circuit board.

Embodiments of the present invention may provide connectors having high-speed paths between a daughter or optional card and a printed circuit board. Specifically, first portions 122 and second portions 124 of contacts 120 may form short and direct paths over which one or more signals and power supplies may travel. Also, these paths may be shielded by shield 130, which may improve signal quality and allows for faster data rates. By splitting shield 130 into multiple portions, ground connections between ground on a card and a shield may be improved.

Moreover, the short and direct paths provided by contacts 120 may allow connector 100 to have a low profile. A third portion of contacts 120 may be used to provide mechanical stability. This third portion may be approximately in line with first portions 122, and parallel to a bottom of the connector 100.

Embodiments of the present invention may provide connectors that improve the reliability of the manufacturing process. Specifically, first portions 122 may be surface mounted contacts. These first portions 122 may be soldered to pads or contacts on the printed circuit board. This may allow for easy inspection of solder connections of contacts 122 the printed circuit board. Also, openings 114 may allow for inspection to ensure that a card is properly inserted into connector 100.

Figure 2:
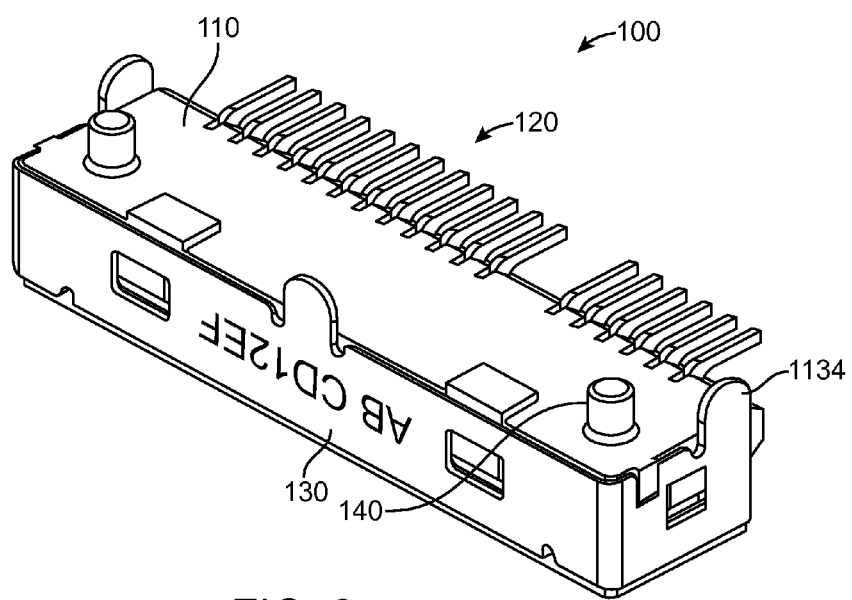
FIG. 2 illustrates a bottom perspective view of a connector according to an embodiment of the present invention.

FIG. 2 illustrates a bottom perspective view of a connector 100 according to an embodiment of the present invention. This figure includes insulative housing 110, a plurality of contacts 120, and shield 130.

Insulative housing 110 may include tabs 140. These tabs may be used to provide mechanical support for connector 100 on a printed circuit board.

Tab 134 may be used to form an electrical connection between shield 130 and ground lines or planes on a printed circuit board.

In various embodiments of the present invention, housing 110 may be plastic or other insulative material. Contacts 120 may be stainless steel, copper, brass, aluminum, or other conductive material. Similarly, shield 130 may be stainless steel, copper, brass, aluminum, or other conductive material.

While eighteen contacts are shown in this specific example, in other embodiments of the present invention, other numbers of contacts may be used. Also, while first portions 122 are shown as extending from the front of contacts 100, in other embodiments of the present invention they may extend in other directions. For example, they may extend in a downward direction, or they may extend towards the back of connector 100. In other embodiments of the present invention, first portions 122 and second portions 124 of contacts 120 may be the same portion. Moreover, while shield 130 is shown as having a particular configuration, other configurations may be possible. For example, shield 130 may not be split into multiple portions, while in other embodiments of the present invention, shield 130 may be split into two or more portions. Also, while one or more openings 114 are shown in top of insulative housing 110, in other embodiments, these openings may be omitted, there may be more or fewer than two openings 140, and the openings may be provided elsewhere.

Again, connector 100 may accept or receive a daughter or optional card. An example is shown in the following figure.

Figure 3:
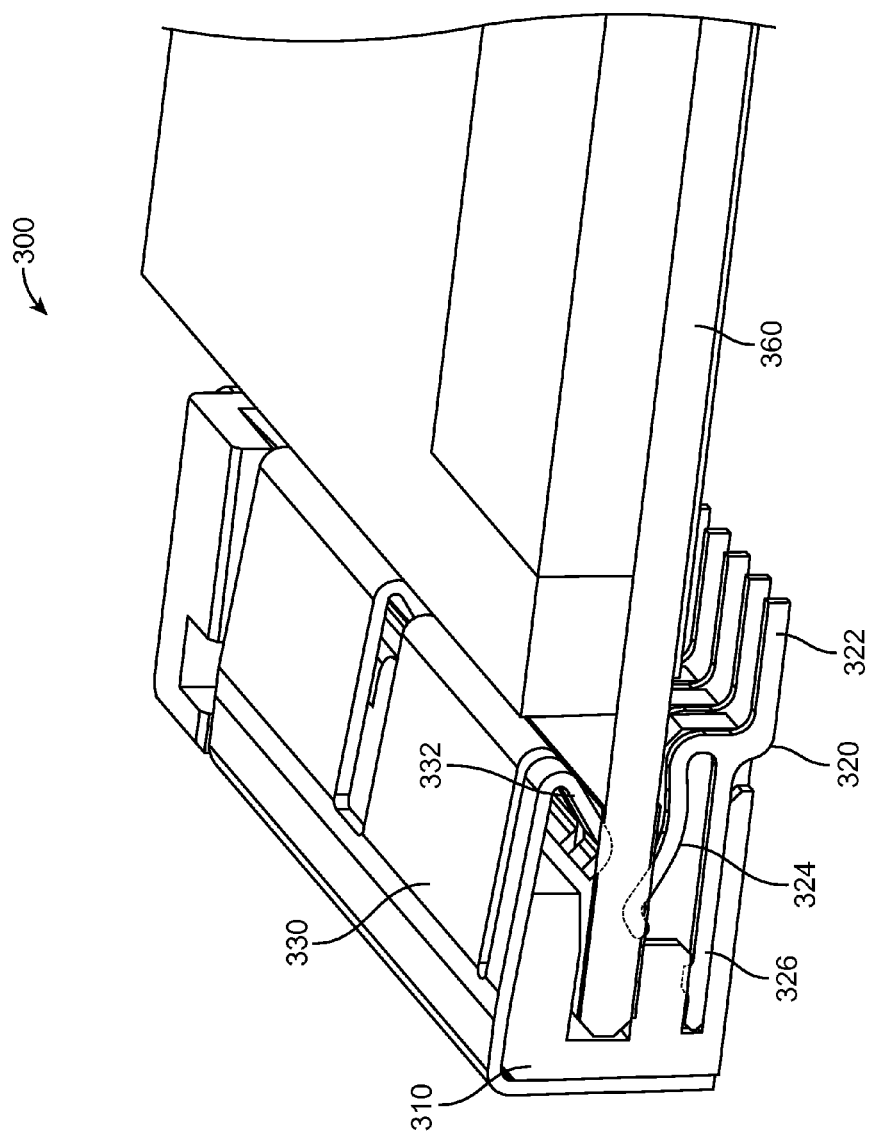
FIG. 3 illustrates a daughter or optional card inserted into a connector according to an embodiment of the present invention.

FIG. 3 illustrates a daughter or optional card inserted into a connector according to an embodiment of the present invention. This example includes a connector 300 receiving a daughter or optional card 360. When card 360 is inserted into connector 300, contacts on a top of card 360 may form electrical connections with portion 332 of shield 330. Contacts on a bottom portion of card 360 may form electrical connections with second portions 324 of contacts 320.

Again, embodiments of the present invention may provide a very short signal path from card 310 to a printed circuit board on which connector 300 resides. Specifically, the signal path may include first portion 322 and second portion 324 of contacts 320.

Contacts 320 may also provide mechanical stability by including third portion 326. Specifically, third portion 326 may extend into insulative housing 310. In this example, second portion 324 and third portion 326 may extend into insulative housing 310, while first portion 322 may extend away from the front of connector 300. Second portion 324 and third portion 326 of contact 320 may be approximately in line with first portion 322. Third portion 326 may extend approximately parallel to a bottom of connector 300.

Figure 4:
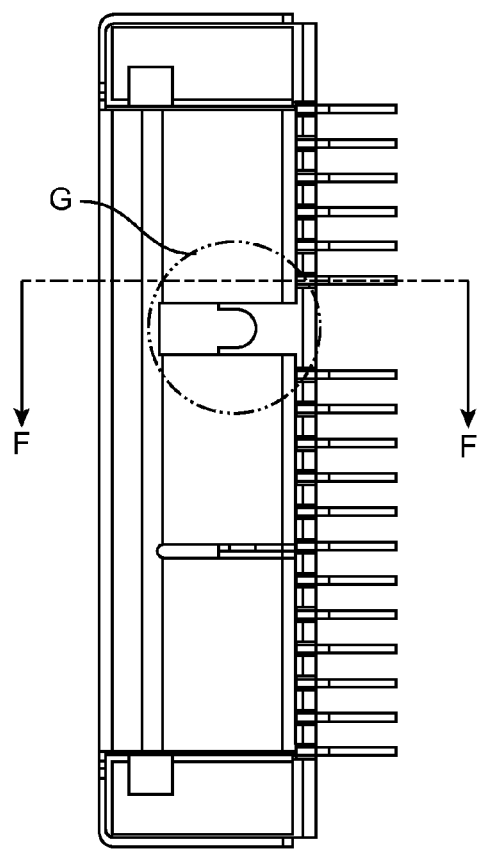
FIG. 4 illustrates a top view of a connector according to an embodiment of the present invention.

FIG. 4 illustrates a top view of a connector according to an embodiment of the present invention.

Figure 5:
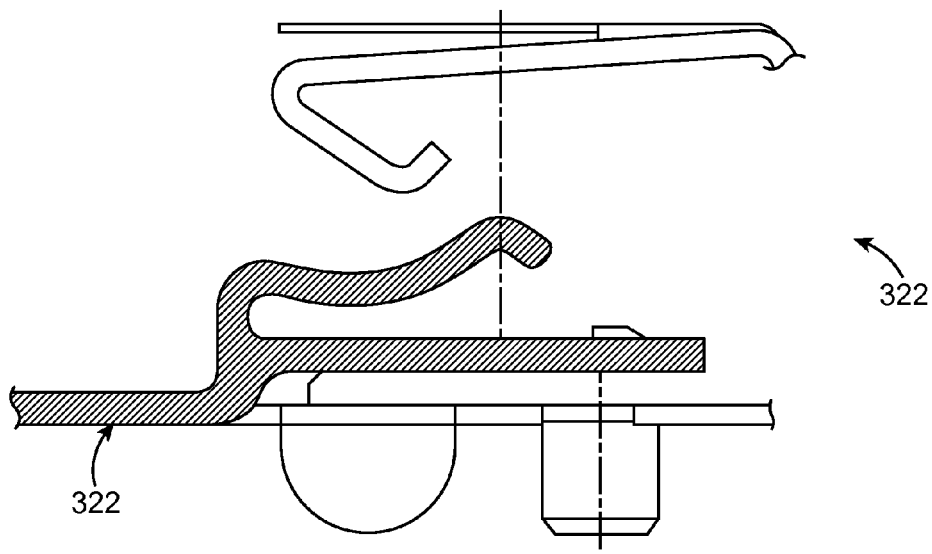
FIG. 5 illustrates a cross-section of view of a connector receptacle according to an embodiment of the present invention.

FIG. 5 illustrates a cross-sectional view along the line F-F of the connector receptacle of FIG. 4. This figure illustrates a cross-sectional view of contact 520 and shield 530 according to an embodiment of the present invention.

Figure 6:
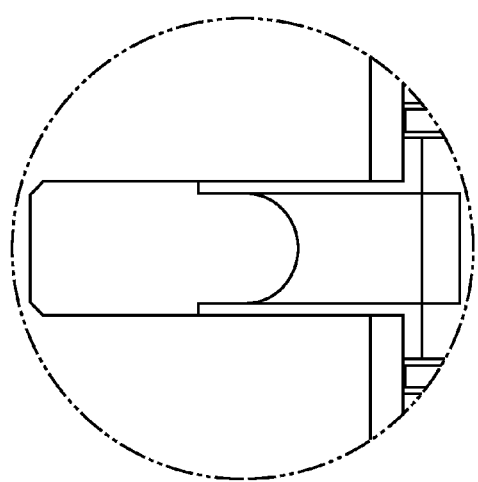
FIG. 6 illustrates a detail of a portion of a top of a connector according to an embodiment of the present invention.

FIG. 6 illustrates a detail of a portion of the top of a connector according to an embodiment of the present invention.

Figure 7:
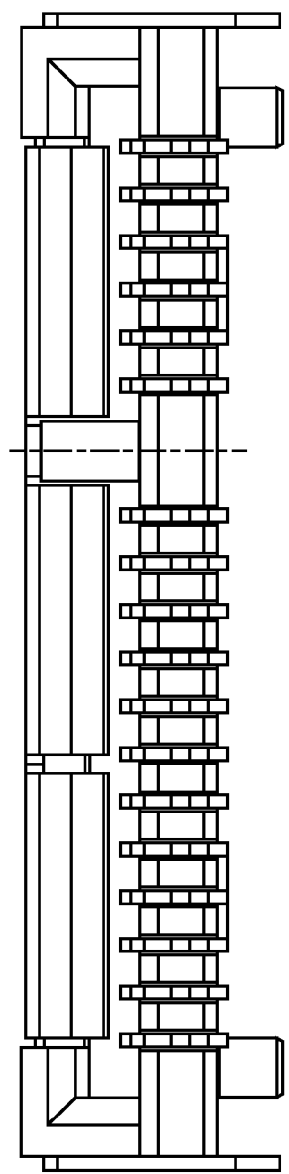
FIG. 7 illustrates a front view of a connector according to an embodiment of the present invention.

FIG. 7 illustrates a front view of a connector according to an embodiment of the present invention.

Figure 8:
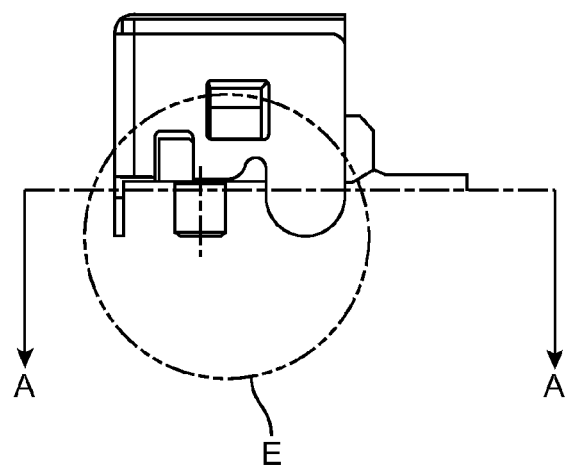
FIG. 8 illustrates a side view of a connector according to an embodiment of the present invention.

FIG. 8 illustrates a side view of a connector according to an embodiment of the present invention.

Figure 9:
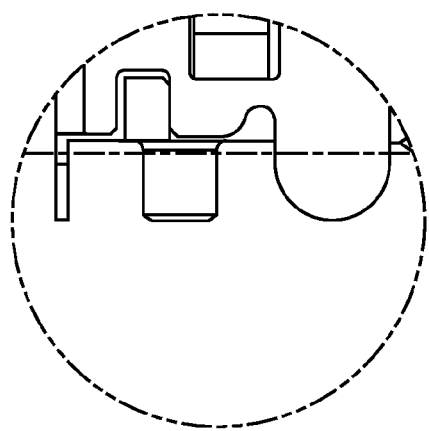
FIG. 9 illustrates a detail of a side view according to an embodiment of the present invention.

FIG. 9 illustrates a detail of a side view according to an embodiment of the present invention.

Figure 10:
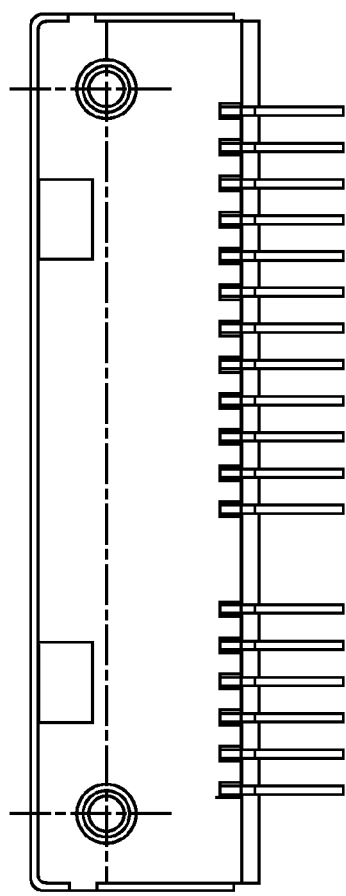
FIG. 10 illustrates a bottom view of a connector according to an embodiment of the present invention.

FIG. 10 illustrates a bottom view of a connector according to an embodiment of the present invention.

Again, in these examples, illustrative examples of embodiment of the present invention have been shown. It should be noted that variations on portions of these connectors, such as insulative housings 110, contacts 120, and shields 130, and portions thereof, may be made consistent with embodiments of the present invention, and none of these are required to have the particular shape, size, arrangement, or other characteristics shown in the figures in order for a connector according to an embodiment of the present invention to function properly.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A connector to form a plurality of signal paths between a printed circuit board and a card, the connector comprising:
an insulative housing having an opening in a front surface to receive the card;
a plurality of contacts, each having:
a first portion extending away from the front surface of the housing to attach to a contact on a surface of the printed circuit board;
a second portion approximately in line with the first portion to form an electrical connection with a contact on a bottom of the card; and
a third portion extending into the insulative housing; and
a shield over at least a top and back portion of the insulative housing, the shield holding the card in place when the card is inserted into the connector.

2. The connector of claim 1 wherein the card is a memory card.

3. The connector of claim 1 wherein the card is a solid state drive.

4. The connector of claim 1 wherein the card is a wireless networking card.

5. The connector of claim 1 wherein the first portion comprises a surface mount connector.

6. The connector of claim 1 wherein the third portion extends into the insulative housing in a direction approximately parallel to a bottom of the connector.

7. The connector of claim 1 wherein the third portion provides mechanical stability.

8. The connector of claim 1 wherein the shield provides a ground plane.

9. The connector of claim 1 wherein the shield forms an electrical connection with a contact on the top of the card.

10. The connector of claim 1 wherein the shield is split into multiple portions.

11. A connector comprising:
an insulative housing having an opening in a front surface and at least one opening in a top surface;
a plurality of contacts, each having:
a first portion extending away from the front surface of the housing; and
a second portion approximately in line with the first portion; and
a shield over at least a top and back portion of the insulative housing to form a ground plane,
wherein the first portion of each of the plurality of contacts extends beyond a front of the housing and the shield.

12. The connector of claim 11 wherein the connector is arranged to receive a card, wherein the at least one opening in the top surface may be used to ensure the card is properly received by the card.

13. The connector of claim 11 where the insulative housing comprises two openings in the top surface, wherein the openings in the top surface may be used to ensure the card is properly received by the connector.

14. The connector of claim 11 wherein each of the plurality of contacts further comprises a third portion extending into the insulative housing.

15. The connector of claim 14 wherein the third portion provides mechanical support.

16. The connector of claim 15 wherein the third portion is approximately in line with the first portion and extends into the housing in a direction approximately parallel to a bottom of the connector.

17. The connector of claim 11 wherein the shield holds a card in place when a card is inserted into the connector.

18. The connector of claim 17 wherein the shield is split into multiple portions.

19. A connector to form a plurality of signal paths, the connector comprising:
an insulative housing having an opening in a front surface;
a plurality of contacts, each having:
a first portion extending away from the front surface of the housing;
a second portion approximately in line with the first portion; and a third portion extending into the insulative housing to provide mechanical support; and a shield over at least a top and back portion of the insulative housing, wherein the first portion of each of the plurality of contacts extends beyond a front of the housing and the shield.

20. The connector of claim 19 where the insulative housing comprises a plurality of openings in the top surface, wherein the plurality of openings in the top surface may be used to ensure a card is properly received by a connector.

21. The connector of claim 19 wherein the first portion comprises a surface mount connector.

22. The connector of claim 19 wherein the shield holds a card in place when the card is inserted into the connector.

23. The connector of claim 22 wherein the shield is split into multiple portions.

24. The connector of claim 22 wherein the card is a solid state drive.

25. The connector of claim 22 wherein the card is a wireless networking card.

* * * * *